United States Patent [19]

Crumley et al.

[11] 4,429,301
[45] Jan. 31, 1984

[54] MEANS FOR DECODING A SWITCH ARRAY

[75] Inventors: J. A. Crumley, Enola; John P. Weaver, Lancaster, both of Pa.

[73] Assignee: AMP Incorporated, Harrisburg, Pa.

[21] Appl. No.: 314,600

[22] Filed: Oct. 26, 1981

[51] Int. Cl.³ .............................................. G06F 3/02
[52] U.S. Cl. ............................ 340/365 S; 340/365 R; 340/825.79
[58] Field of Search ............ 340/365 R, 365 S, 365 E, 340/365 VL, 825.79; 178/18, 17 C, 17 A; 179/90 K; 200/5 A

[56] References Cited

U.S. PATENT DOCUMENTS

| | | | |
|---|---|---|---|
| 3,304,612 | 2/1967 | Proctor et al. | 178/18 |
| 3,798,370 | 3/1974 | Hurst | 178/18 |
| 4,015,254 | 3/1977 | Strandt | 340/365 S |
| 4,078,257 | 3/1978 | Bagley | 340/365 VL |
| 4,164,622 | 8/1979 | Pobgee | 178/18 |

Primary Examiner—James J. Groody
Attorney, Agent, or Firm—F. Brice Faller

[57] ABSTRACT

Crossbar switch array employs two linear conductors having resistors thereon, with horizontal and vertical crossbar conductors connected to linear conductors between the resistors. All resistors have identical value, so that when a switch is closed, voltage readings taken at one end of each of the linear conductors permit calculation of the number of resistors passing current in each linear conductor where a constant current source is provided. An analog signal is developed which is proportional to the row and column of the closed switch.

8 Claims, 2 Drawing Figures

MEANS FOR DECODING A SWITCH ARRAY

BACKGROUND OF THE INVENTION

The present invention relates to a method and apparatus for decoding a large crossbar switch array.

Crossbar switch arrays commonly find use on cathode ray tube (CRT) faces as overlays which provide a means for codifying information corresponding to an image on the CRT. The switches are commonly made by photofabricating a large number of horizontal switch lines on a plastic lamina and a large number of vertical lines on another lamina and sandwiching a perforated plastic lamina between the horizontal and vertical array laminas. The laminated switch assembly, which is transparent except for the switch lines, is then placed on the CRT. The cross-over points between horizontal and vertical switch lines act as switches which are closed by depressing one of the lamina to press the upper switch line into a perforation and against a line on the other lamina.

In switch arrays as described above, each horizontal and vertical line is connected to the outside by a discrete line which enters a discrete logic element for digital decoding of the position of the closed switch. Where the matrix of switch lines is large, it is impractical to bring each line off the laminate as would be required for external decoding. It is also impractical to provide a logic element for each line.

SUMMARY OF THE INVENTION

The present invention comprises an analog method of providing a coded output to the external world indicating which switch pair is closed. A linear conductor having a series of discrete resistors thereon, or alternatively a continuous resistive element, is provided across one end of the horizontal array of conductors and one end of the vertical array. The resistance between adjacent conductors is R. A constant current source is provided such that when any switch is closed a current I flows. By measurement of voltages at two points, an analog signal is developed proportional to the row and column number of the closed switch. Analog to digital converters output binary codes corresponding to the row and column numbers.

It is an object of the invention to provide a simpler method for decoding the output of a large crossbar switch array than heretofore available.

It is a further object to provide circuitry for practicing said method which is susceptible to a variety of manufacturing methods.

DETAILED DESCRIPTION OF THE PREFERRED EMBODIMENT

Figure 1:
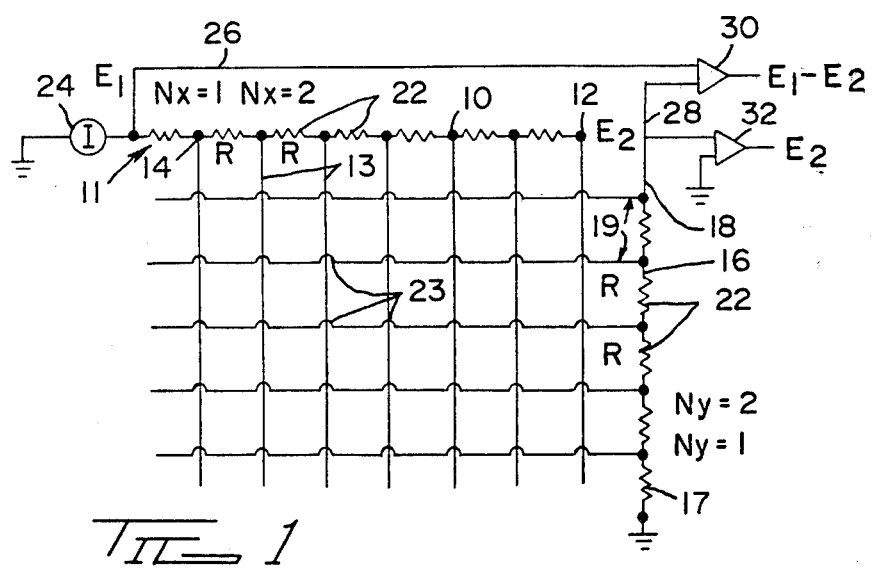
FIG. 1 is a diagram of the circuit.

FIG. 1 shows the circuitry required to practice the present invention. A first linear conductor 10 having a first end 11 and a second end 12 has a plurality of resistors 22 thereon and connection points 14 to vertical or first crossbar conductors 13 adjacent to each resistor 22 toward the second end 12. A second linear conductor 16 having a first end 17 and a second end 18 has a plurality of resistors 22 thereon and connection points 20 to horizontal or second crossbar conductors 19. All resistors 22 have an identical resistance value R. The intersections of vertical crossbar conductors 13 and horizontal crossbar conductors 19 are the switchable connections or switches 23. When a switch 23 is closed, current flows from source 24 of constant current I, through a portion of first conductor 10, through the switch 23 which is closed, and through a portion of second linear conductor 16 to ground at first end 17 of second linear conductor 16. The current passes through $N_x$ resistors on conductor 13 and $N_y$ resistors on conductor 16, where $N_x$ and $N_y$ are determined by the position of the closed switch in the switch matrix. In the circuit shown, $N_x = 1$ to 7 and $N_y = 1$ to 5.

A first voltage tap 26 located at first end 11 will pick up a voltage $E_1$ calculable from the equation $E_1 = IR(N_x + N_y)$. A second voltage tap 28 located at second end 18 will pick up a voltage $E_2$ calcuable from the equation $E_2 = IRN_y$. As the voltages $E_1$ and $E_2$ are known, the position of a closed switch may be determined from the equations $N_x = (E_1 - E_2)/IR$ and $N_y = E_2/IR$. The position x,y of a closed switch is thus proportional to the voltages $E_1 - E_2$, $E_2$ respectively. A substractor amplifier 30 transmits the value $E_1 - E_2$ to an analog to digital converter for binary coding, while a unity gain amplifier 32 transmits the value $E_2$ to an analog to digital converter.

In practice, I is a very small current, e.g., 0.1 ma, and the constant value R is on the order of 1000 ohms. The product IR is thus 0.1, $N_x = 10(E_1 - E_2)$ and $N_y = 10E_2$. As an example, where $N_x = 3$ and $N_y = 2$, $E_1 = 0.5$ v and $E_2 = 0.2$ v. Conversely, the given voltage values will yield only the given switch position. The input resistance of amplifiers 30, 32 is quite high, say over 200R, so that negligible current is drawn through resistors between $N_y$ and the amplifier input. $E_2$ is therefore essentially the voltage from $N_y$ to ground.

Several methods of manufacture are contemplated. The commonest method of the prior art may be employed by photofabricating copper lines onto laminar transparent plastic. The first linear conductor 10 and first crossbar conductors are formed on a first lamina while the second linear conductor and second crossbar conductors are formed on a second lamina. The linear conductors 10, 16 are formed with gaps where discrete resistors 22 are either soldered or placed with conductive adhesive. Alternatively, resistive ink may be silk screened into the gaps to form the resistors, and conductive ink could be used for the crossbar conductors on the lamina. A perforated transparent separator is sandwiched between the lamina with perforations between the crossbar conductors. The first crossbar conductors are placed at a right angle to the second crossbar conductors and the perforations are in a rectangular array which corresponds to the cross-over points, which thus form switches. A switch is closed by depressing the area on the top lamina corresponding to the perforation below, which deforms the flexible plastic into the perforation to bring a pair of perpendicular crossbar conductors together.

Another manufacturing method would entail photofabricating copper crossbar conductors and silk screening resistive ink into a continuous resistive element in place of a conductive element with discrete resistors. The resistors 22 are thus defined by the lengths of resistive element between connection points 14, 20. It should be understood that the use of terms linear conductor with resistors thereon is broad enough to encompass a linear resistive element without discrete resistors per se.

Figure 2:
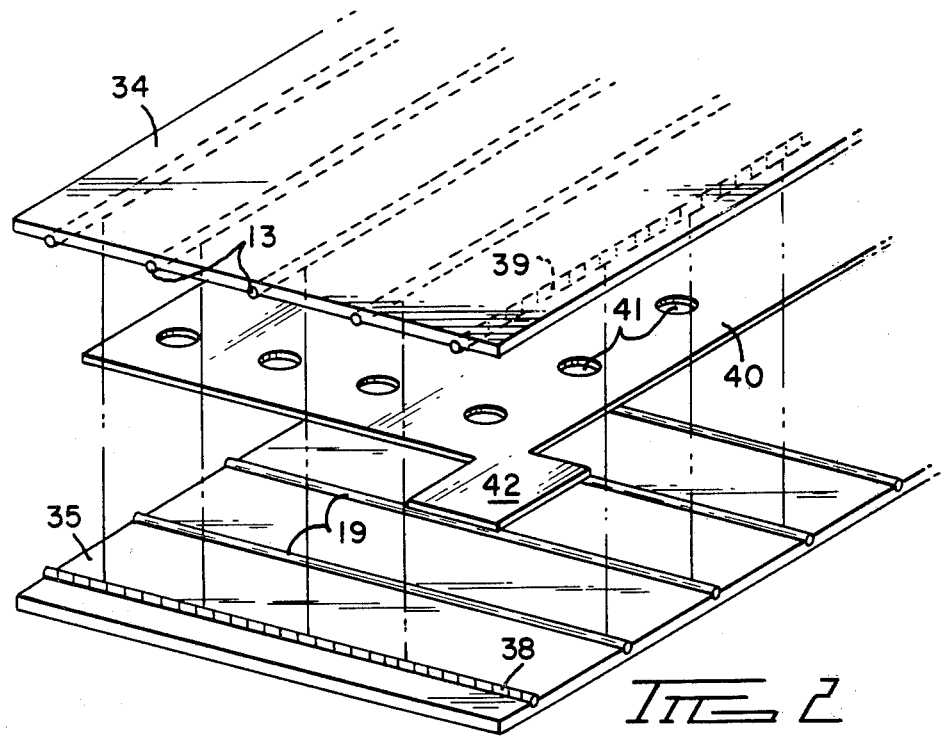
FIG. 2 is an exploded perspective of a switch array according to one method of manufacture.

The general structure discussed above is illustrated in FIG. 2, with the exception that the second linear conductor 16 and resistors 22, in the form of a continuous resistive element 39, is formed parallel to the first crossbar conductors 13 on first lamina 34. The first linear conductor 10, in the form of continuous resistive element 38, is likewise formed parallel to the second crossbar conductors 19 on second lamina 35. The separator 40 with perforations 41 fits between the crossbar arrays but falls short of the resistive elements 38, 39 which can thus be connected to crossbar elements 13, 19 respectively. A tab 42 on the separator prevents the resistive elements 38, 39 from contacting each other. The crossbar conductors 13, 19 are preferably copper wire and the resistive elements 38, 39 a high resistance alloy such as nichrome. The lamina 34, 35 can thus be formed in a single continuous strip with the circuit elements embedded therein, and cut into squares to form both first and second lamina 34, 35.

We claim:

1. Apparatus for decoding a switch array comprises:
   a first linear conductor having a first plurality $N_x$ of individual resistors in series thereon, each resistor having the same constant value R, said conductor having a first end and a second end,
   a like first plurality $N_x$ of first parallel crossbar conductors connected to said first linear conductor, each said crossbar conductor being connected adjacent to one of said resistors toward said second end,
   a second linear conductor having a second plurality $N_y$ of individual resistors in series thereon, each resistor having the same constant value R as those on said first linear conductor, said conductor having a first end and a second end,
   a like second plurality of second parallel crossbar conductors connected to said second linear conductor, each said crossbar conductor being connected adjacent to one of said resistors toward said second end,
   switchable connections between each of said first parallel crossbar conductors and each of said second parallel crossbar conductors, whereby, any of said first crossbar conductors is switchably connectable to any of said second crossbar conductors,
   a source of constant current I at said first end of said first linear conductor,
   ground means at said first end of said second linear conductor,
   means for indicating the potential $E_1$ at the first end of said first linear conductor adjacent said current source toward said second end,
   means for indicating the potential $E_2$ at the second end of said second linear conductor, whereby, upon closing a switchable connection, a constant current I will pass through a portion of said first linear conductor, through said switchable connection, and through a portion of said second linear conductor to ground, whereby the number $N_x$, $N_y$ of resistors on said first and second linear conductors respectively through which current passes may be determined according to the formulas $N_x = (E_1 - E_2)/IR$ and $N_y = E_2/IR$, whereby the location of said closed switchable connection may be determined.

2. The apparatus of claim 1 wherein said first and second parallel crossbar conductors are in respective first and second planar arrays against opposite sides of a perforated planar dielectric separator, said first array being oriented so that the crossbar conductors therein are substantially perpendicular to the crossbar conductors in said second array, each said crossbar conductor in said first array crossing over every conductor in said second array at points corresponding to perforations in said separator, whereby said cross-over points form said switchable connections, said connections being closed by bearing against a cross-over point in said first array so that the corresponding first crossbar conductor is pressed through the corresponding perforation and against the corresponding second crossbar conductor.

3. The apparatus of claim 2 wherein said first and second planar arrays of crossbar conductors are on the surfaces of respective first and second flexible dielectric laminas.

4. The apparatus of claim 3 wherein said first sheet, said second sheet, and said separator therebetween are transparent.

5. The apparatus of claim 3 wherein said crossbar conductors are conductive ink.

6. The apparatus of claim 3 wherein said first linear conductor and said second crossbar conductors are all in parallel on the surface of said first flexible dielectric lamina, said second linear conductor and said first crossbar conductors are on the surface of said second flexible dielectric lamina, said linear conductors lying beyond the periphery of said separator, said first and second linear conductors being connected to respective said first and second crossbar conductors when said first and second flexible dielectric laminas and said separator are assembled.

7. The apparatus of claim 1 wherein said linear conductors each comprise a continuous resistive element to which said crossbar conductors are connected, said individual resistors being defined by the respective lengths of resistive element between connections to said crossbar conductors.

8. An apparatus for decoding a switch array as in claim 1 wherein said means for indicating the potential $E_1$ comprises a first voltage tap and said means for indicating the potential $E_2$ comprises a second voltage tap, said first and second voltage taps being connected to a subtractor amplifier for transmitting the value $E_1 - E_2$, said second voltage tap being connected to a unity gain amplifier for transmitting the value $E_2$.

* * * * *